United States Patent

Nakamura et al.

[11] Patent Number: 5,438,482
[45] Date of Patent: Aug. 1, 1995

[54] ELECTRONIC APPARATUS HAVING A SHIELD STRUCTURE

[75] Inventors: Yutaka Nakamura; Noboru Koike, both of Tokyo, Japan

[73] Assignee: Kabushiki Kaisha Toshiba, Kanagawa, Japan

[21] Appl. No.: 254,057

[22] Filed: Jun. 3, 1994

[30] Foreign Application Priority Data

Jul. 28, 1993 [JP] Japan .................................. 5-186120

[51] Int. Cl.6 .............................................. H05K 9/00
[52] U.S. Cl. ..................................... 361/816; 361/796; 361/818; 361/800; 174/35 R; 174/35 TS
[58] Field of Search ............... 361/748, 749, 752, 729, 361/736, 796, 799, 800, 807, 810, 816, 818; 174/35 R, 35 TS, 51; 439/76, 77; 257/659

[56] References Cited

U.S. PATENT DOCUMENTS

| | | | |
|---|---|---|---|
| 4,399,487 | 8/1983 | Neumann | 361/391 |
| 4,717,989 | 1/1988 | De Barros et al. | 361/424 |
| 4,890,199 | 12/1989 | Beutler | 361/424 |
| 5,053,924 | 10/1991 | Kurgan . | |

*Primary Examiner*—Leo P. Picard
*Assistant Examiner*—Young Whang
*Attorney, Agent, or Firm*—Finnegan, Henderson, Farabow, Garrett & Dunner

[57] ABSTRACT

A shield structure for use in an electronic apparatus includes a shield case for covering a first and second circuitry block and for isolating each other. In order to enhance the electrical connection of the shield case to a first ground on a first circuit board and a second ground on a second circuit board, a conductive component is fastened to the shield case. The conductive component includes a fastening portion, a first contact portion contacting the first ground, and a second contact portion contacting the second ground.

20 Claims, 3 Drawing Sheets

ELECTRONIC APPARATUS HAVING A SHIELD STRUCTURE

BACKGROUND OF THE INVENTION

1. Field of the Invention

This invention is generally related to a shield structure, and more particularly to a shield structure in which a shield case shields a first circuitry block mounted on a first circuit board and a second circuitry block mounted on a second circuit board in an electric apparatus.

2. Description of the Related Art

An electronic apparatus includes electronic components which often generate electromagnetic signals. The signals may radiate and interfere with the operation of other components. Further, the electronic apparatus may receive electromagnetic signals which are generated by other components and may cause interference with its own internal operation. To minimize interference, an electrically conductive case generally is provided to shield the electronic components from other components.

Further, an electric apparatus such as a portable apparatus often includes a plurality of circuit boards to provide many components in the electric apparatus. For ease of explanation, components on a first circuit board are referred to as a first circuitry block hereinafter, and components on a second circuit board are referred to as a second circuitry block hereinafter. If the first circuitry block includes components which may generate electromagnetic signals, the first circuitry block is required to be covered by a conductive shield case. Likewise, if the second circuitry block includes components which may generate electromagnetic signals, the second circuitry block is required to be covered by a conductive shield case.

In order to decrease the size and weight of the electronic apparatus, the first and second circuitry blocks are often covered by only one conductive material having two partitioned spaces, instead of two conductive shield cases. Accordingly, the electronic apparatus becomes light and small. An example of such a conventional structure is shown in FIGS. 5 and 6. Referring to FIG. 5, an electronic apparatus 1 comprises a housing 2, a first circuit board 4, a second circuit board 6, and a shield case 8 made of aluminum. Components 8a and 8b constituting a first circuitry block 10 are mounted on the first circuit board 4. Components 12a, 12b, and 12c constituting a second circuitry block 14 are mounted on the second circuit board 6. Further, a first ground 16 is provided on the first circuit board 4. A second ground 18 is provided on the second circuit board 6. The shield case 8 comprises side walls 20 and a partition wall 22 to divide the space within the shield case 8 into two sections. When the shield case 8 is attached to the first and second circuit boards 4, 6, the first and second circuitry blocks 10, 14 are shielded against other components.

To enhance the connection state between the shield case 8 and the grounds 16, 18, as shown in FIG. 6, conductive braid materials 24, 25 having an elastic nature are provided between the shield case 8 and the circuit boards 4, 6. Specifically, the wall 20 has grooves 26, 28 at opposite end faces 30, 32 for supporting the conductive braid materials 24, 25. When the conductive braid materials 24, 25 are engaged with the grooves 26, 28, and the first circuit board 4 and the second circuit board 6 are attached to the shield case 8, the shield case 8 is sufficiently coupled to the ground 16, 18 due to the elastic nature of the conductive braid materials 24, 25.

However, the grooves 26, 28 are provided in each of the end faces 30, 32. Therefore, the total area of the end faces 30, 32 is relatively large. As a result, the space in each of the circuit boards 4, 6 occupied by the wall 20 must be increased. Further, the size of the shield cases 8 similarly becomes relatively large.

Since electronic apparatus such as portable radio telephone apparatus are increasingly becoming miniaturized, the area in the circuit boards 4,6 required for the end faces of the shield case 8 is increasingly becoming a design constraint which limits further miniaturization of the electronic apparatus. Further, the size of the shield cases 8 similarly is also increasingly becoming a design constraint which limits further miniaturization of the electronic apparatus.

Further, the attachment of the conductive braid materials 24, 25 to the grooves 26, 28 must be performed along the entire end faces having the grooves 26, 28. Therefore, it is inconvenient.

Furthermore, the shield case 8 is electrically coupled to the grounds 16, 18 by the two conductive braid materials 24, 25. As a result, four contact portions exist between the grounds 16, 18. A portion between the ground 16 and the ground 18 has a contact resistance corresponding to the four contact portions. Since the portion covering the components has a relatively high resistance, the portion can function as an antenna which can receive electromagnetic signals transmitted by the other components outside of the shield case 8. This tendency is well known in the prior art. As a result, the portion can radiate the received electromagnetic signals to the first and second circuitry blocks 10, 14 in the shield case 8. These radiated electromagnetic signals can interfere with the normal operation of the first and second circuitry blocks 10, 14.

SUMMARY OF THE INVENTION

Accordingly, the present invention has been made in view of the above circumstance and has an object to provide an electric apparatus having a shield structure of reduced size.

Another object of the present invention is to provide an electric apparatus having a shield structure which facilitates attachment of an improved connecting means for connecting a shield case to grounds on first and second circuit boards.

Further, another object of the present invention is to provide an improved connecting means which can enhance the shielding of a first circuitry block on the first circuit board and a second circuitry block on the second circuit board against electromagnetic interference from other external components.

Additional objects and advantages of the invention will be set forth in part in the description which follows and in part will be apparent from the description, or may be learned by practice of the invention. The objects and advantages of the invention may be realized and attained by means of the instrumentalities and combinations particularly pointed out in the written description and claims hereof as well as the appended drawings. To achieve these and other objects and advantages and in accordance with the purposes of the invention, there is provided an electronic apparatus comprising, a first circuit board having a first ground, a first circuitry block being mounted on the first circuit board, a second circuit board having a second ground, a second circuitry block being mounted on the second circuit board, a conductive shield case having a wall for protecting the first circuitry block and the second circuitry block, and a partition connected to the wall for electromagnetically isolating the first circuitry block from the second circuitry block, the wall having opposite ends, and a conductive component including a fastening portion for fastening the conductive component to the conductive shield case, a first contact portion opposite to said one end of the wall, a second contact portion opposite to the other end of the wall, and a connecting portion for connecting the first contact portion to the second contact portion, wherein the first contact portion contacts the first ground and the second contact portion contacts the second ground. There is further provided a conductive component for use in an electronic apparatus having a first circuit board with a first ground and a first circuitry block, a second circuit board with a second ground and a second circuitry block, and a conductive shield case having a wall for protecting the first circuitry block and the second circuitry block, and a partition connected to the wall for electromagnetically isolating the first circuitry block from the second circuitry block, the wall having opposite ends, the conductive component comprising, a fastening portion for fastening the conductive component to the conductive shield case, a first contact portion opposite to one end of the wall, a second contact portion opposite to the other end of the wall, and a connecting portion for connecting the first contact portion to the second contact portion, wherein the first contact portion contacts the first ground and the second contact portion contacts the second ground.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate several embodiments of the invention and, together with the description, serve to explain the objects, advantages, and principles of invention. In the drawings.

DESCRIPTION OF THE PREFERRED EMBODIMENTS

Reference will now be made in detail to the present preferred embodiments of the invention, examples of which are illustrated in the accompanying drawings.

Figure 1:
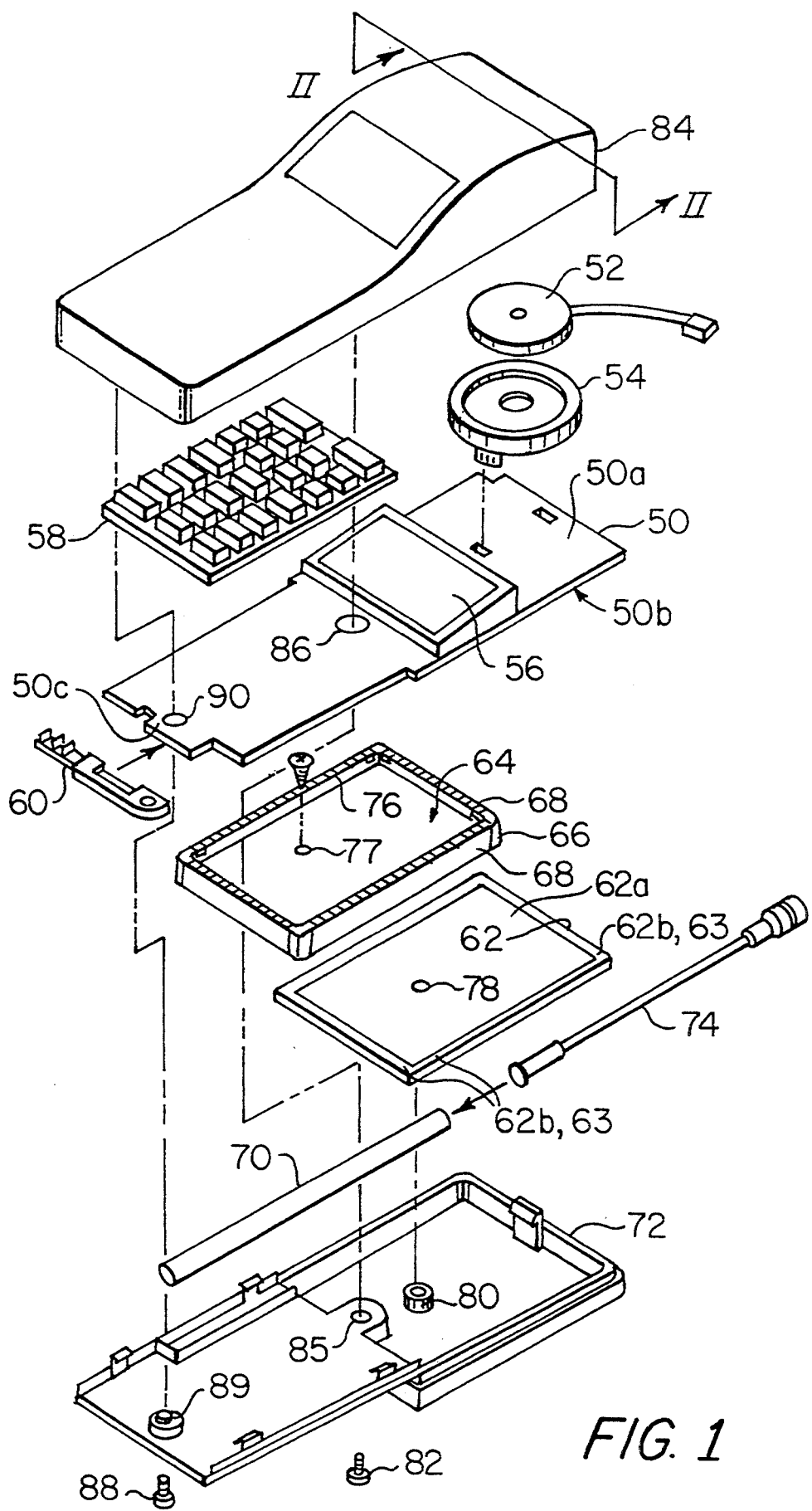
FIG. 1 is an exploded perspective view illustrating an embodiment of a present invention used in a portable radio telecommunication apparatus.

FIG. 1 shows a portable radio telecommunication apparatus referred to as a portable apparatus hereinafter. The portable apparatus has a radio circuit which communicates with another party via the antenna of the portable apparatus. A first circuit board 50 is a double-sided circuit board having top and bottom circuit surfaces 50a and 50b. A receiver 52, a receiver holder 54, a liquid crystal display (LCD) 56, and a keypad 58 are mounted on the top surface 50a of the first circuit board 50. A battery terminal connector 60 is attached to an edge 50c of the first circuit board 50. A first circuitry block, not shown, including logic circuit components, which are required to be shielded, is mounted on the bottom surface 50b of the first circuit board 50. A ground, not shown, is printed on the bottom surface 50b of the first circuit board 50.

A second circuitry block, not shown, including radio circuit components, is mounted on a top surface 62a of a second circuit board 62. A ground 63, referred to as a second ground 63 hereinafter, is printed on an edge 62b of the top surface 62a of the second circuit board 62. In order to shield the first and second circuitry blocks and electromagnetically isolate them from each other, a conductive shield case 64 is attached between the first and second circuit boards 50, 62 in a state where the conductive shield case 64 corresponds to the first and second circuitry blocks. The conductive shield case 64 may be made of a non-conductive material such as polycarbonate, plated with a conductive material, such as nickel. The shield case 64 has side walls 66. A conductive component 68 is attached to each side wall 66.

A lower case 72 may be made of a non-conductive material such as polycarbonate, plated with a conductive material, such as nickel. A non-conductive tube 70 is attached to the lower case 72. An antenna 74 is inserted into the non-conductive tube 70. In this state, a male screw 76 mates with a female screw 80 through holes 77, 78. Thereby, the conductive shield case 64 and the second circuit board 62 are fitted to the lower case 72.

Further, a male screw 82 mates with a female screw (not shown) on a upper case 84 through holes 85, 86. Further, a male screw 88 mates with a female screw (not shown) on the upper case 84 through holes 89, 90. Thereby, the first circuit board 50 and the upper case 84 are attached to the lower case 72. The upper case 84 may be made of a non-conductive material such as polycarbonate, plated with a conductive material, such as nickel.

Figure 2:
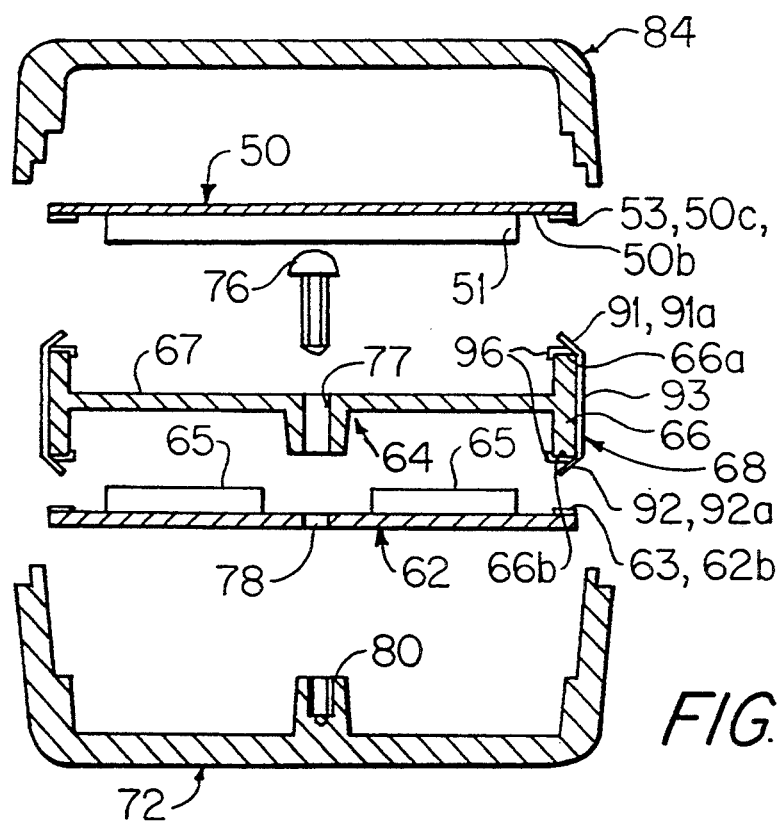
FIG. 2 is a cross-sectional view taken along line II—II of FIG. 1.
Figure 5:
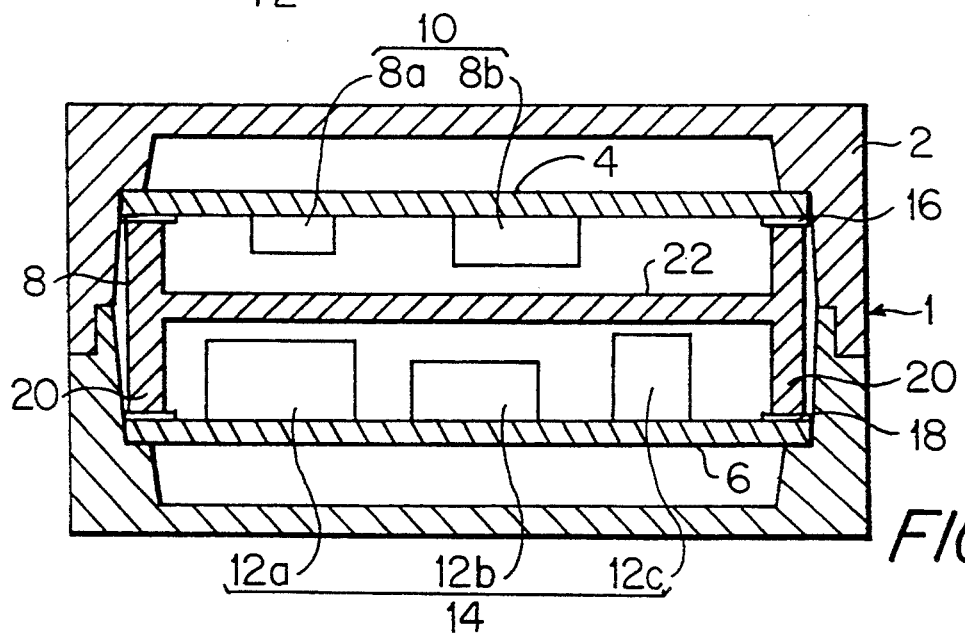
FIG. 5 is a cross-sectional view illustrating a conventional apparatus.
Figure 6:
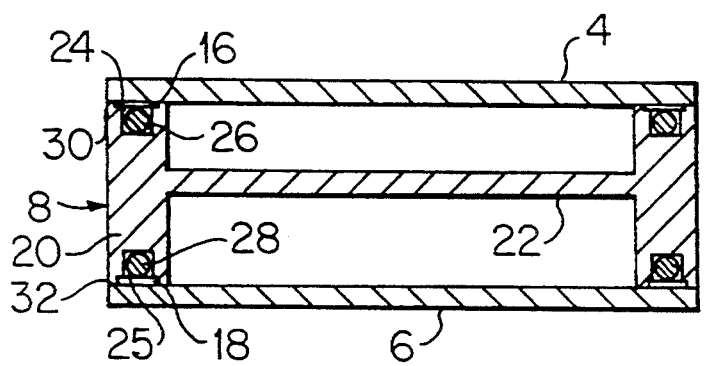
FIG. 6 is a partial cross-sectional side view illustrating a conventional apparatus.

FIG. 2 is a cross sectional view taken along line II—II of FIG. 1 showing a detailed structure of the portable apparatus. The first circuitry block 51 is mounted on the bottom surface 50b of first circuit board 50. A first ground 53 is printed on a portion 50c of the bottom surface 50b of the first circuit board 50. The second circuitry block 65 is mounted on the top surface 62a of the second circuit board 62. The second ground 63 is printed on the top surface 62a of the edge 62b of the second circuit board 62.

The conductive shield case 64 has a wall 66 and a partition 67 for electromagnetically isolating the first circuitry block 51 from the second circuitry block 65. The wall 66 has one end 66a and another end 66b. When the first and second circuit boards 50, 62 and the shield case 64 are enclosed in the upper and lower cases 84, 72, one end 66a is positioned so that one end 66a corresponds to the first ground 53 and the other end 66b is positioned so that the other end 66b corresponds to the second ground 63.

The conductive component 68 further has a clamping portion 96 as a fastening portion for fastening the conductive component 68 to the conductive shield case 64. When the clamping portions 96 clamps both ends of the wall 66, the conductive component 68 is fastened to the wall 66 of the conductive shield case 64.

Figure 3:
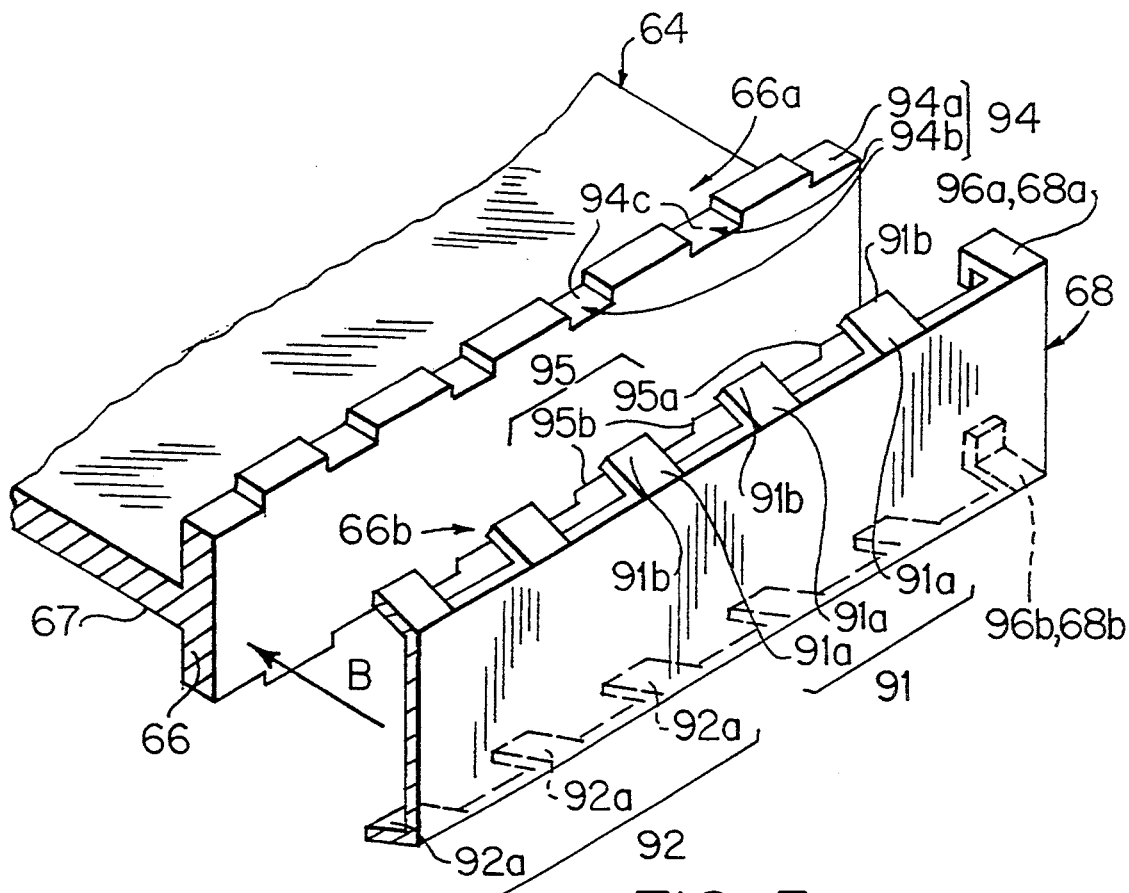
FIG. 3 is an exploded perspective view illustrating the first embodiment of the present invention shown in FIG. 1.

Furthermore, the conductive component 68 has a first contact portion 91 at one end thereof, a second contact portion 92 at the other end thereof, and a connecting portion 93 connecting the first contact portion 91 to the second contact portion 92. The detailed structural relationship between the conductive shield case 64 and the conductive component 68 is shown in FIG. 3.

On one end 66a, a plurality of grooves 94 including grooves 94a, 94b are provided. Similarly, a plurality of grooves 95 including grooves 95a, 95b are provided on the other end 66b.

The conductive component 68 may be made of a metallic material such as phosphor bronze having a thickness of, e.g., approximately 0.15 mm. The conductive component 68 may be formed by bending the metallic material. The clamping portion includes clamps 96a, 96b which are provided at a top end 68a and a bottom end 68b thereof for clamping corresponding grooves 94a, 95a located at right ends of the wall 66 as viewed by one looking at the conductive shield case 64. Further, referring to FIG. 4, the clamping portion 96 including clamps 96c, 96d are provided at a top and bottom ends 68c, 68d opposite to the top and bottom ends 68a, 68b. Thus, the conductive component 68 can clamp the wall 66. As a result, the conductive component 68 is fastened to one of the walls of the conductive shield case 64. Likewise, each of the conductive components 68f, 68g, 68h is fastened to each of the walls 66f, 66g and 66h.

Referring again to FIG. 3, the first contact portion 91 comprises a plurality of first contacts 91a projecting from the connecting portion 93. If the top 91b of each first contact 91a is urged toward the corresponding second contact 92a, each first contact 91a generates a spring back force. Likewise, the second contact portion 92 comprises a plurality of second contacts 92a projecting from the connecting portion 93. If the top of each second contact 92a is urged toward the corresponding first contact 91a, each second contact 92a generates a spring back force.

In the event that the conductive component 66 is fastened to the conductive shield case 64 in the direction of an arrow B, each first contact 91a is positioned opposite to each groove 94b, and each second contact 92a is positioned opposite to each groove 95b.

Figure 4:
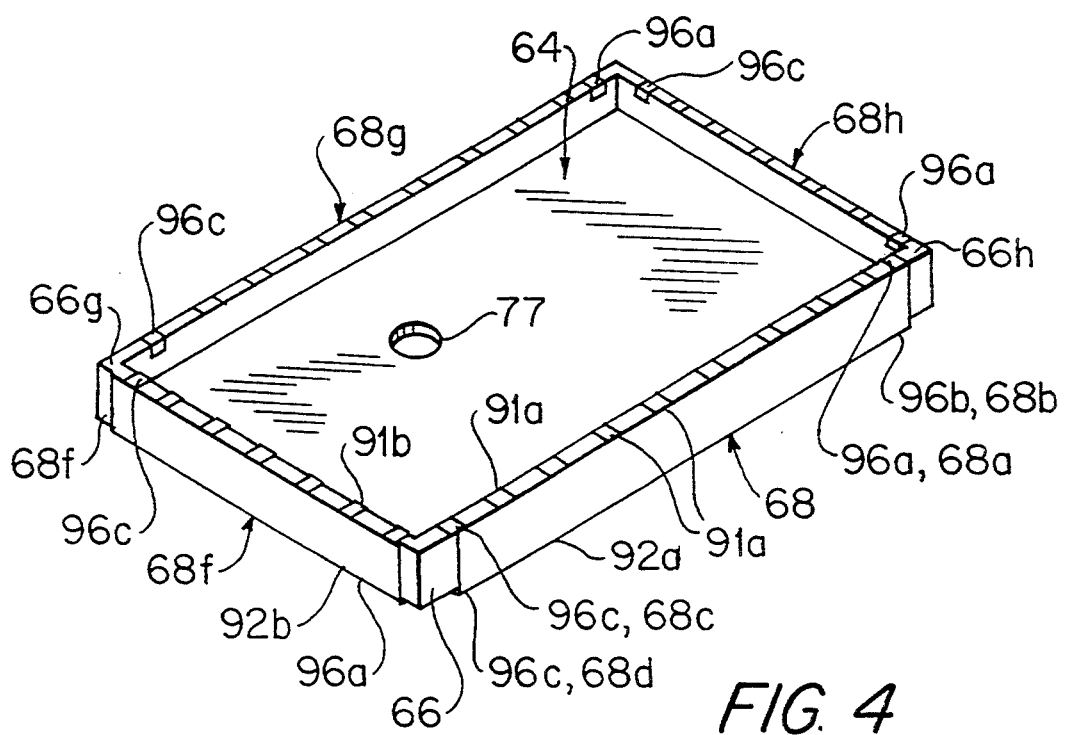
FIG. 4 is a partial perspective view illustrating the first embodiment of the present invention shown in FIG. 1.

As shown in FIGS. 3, 4, the clamp 96a, the first contacts 91a, and the clamp 96c are linearly arranged with a predetermined separation distance which is less than λ/20, where λ represents the wavelength corresponding to a frequency of a radio channel over which the portable apparatus communicates signals with another party. For example, if the frequency of the radio channel is 900 MHz, λ is approximately 34 cm. Therefore, the clamp 96a, the first contacts 91a, and the clamp 96c are linearly arranged with the predetermined separation distance which is less than 1.7 cm corresponding to 34 cm/20. Preferably, in this case, the predetermined separation distance is 5 mm.

Likewise, the clamp 96b, second contacts 92a, and the clamp 96d are linearly arranged with the predetermined separation distance of 5 mm.

Furthermore, referring to FIG. 4, a straight separation distance between the first contact 91a of the conductive component 68 and a first contact 91b of the adjacent conductive component 68f is less than 1.7 cm corresponding to 34 cm/20. Likewise, a straight separate distance between the second contact 92a of the conductive component 68 and a second contact 92b of the adjacent conductive component 68f is also less than 1.7 cm corresponding to 34 cm/20. Further, each of the structures of relationships between the conductive components 68f and 68g, 68g and 68h, 68h and 68 is same as that between the relationship between the conductive componens 68 and 68f.

Further, referring again to FIGS. 2, 3, in the event that the conductive shield case 64, the conductive component 66, the first and second circuit boards 50, 62 are enclosed in the upper case 84 and the lower case 72, each of the first contacts 91a is urged by the first ground 53 of the first circuit board 50 toward a bottom 94c of each of the grooves 94b. Then, each of the first contacts 91a sufficiently contacts the first ground 53 due to the spring back force of each of the first contacts 91a. Likewise, each of the second contacts 92a is urged by the second ground 63 of the second circuit board 50 toward the bottom of each of the grooves 95b. Then, the second contact 92 sufficiently contacts the second ground 63 due to the spring back force of each of the second contacts 92a.

In the prior art, the conventional apparatus requires two conductive braid materials on each end face of the shield case. Accordingly, the total area of the end faces of the shield case must be relatively large. As a result, the area in each of the circuit boards corresponding to the total area of the shield case must be increased. Further, the size of the shield cases similarly must be relatively large. The area of the end faces of the shield case in the circuit boards is increasingly becoming a design constraint which limits further miniaturization of the electronic apparatus. Further, the size of the shield cases similarly is also increasingly becoming a design constraint which limits further miniaturization of the electronic apparatus.

However, in accordance with the present invention, since the conductive component 68 enhances the electrical contact between the conductive shield case 64 and the first and second grounds 53, 63, this structure does not require two conductive braid materials required in the conventional structure. Therefore, the end faces of the wall 66 do not require two grooves for two conductive braids. Further, the clamping portion 96 of the conductive component 68 clamps both end faces 66a, 66b of the wall 66. Thereby, the conductive component 68 is fastened to the shield case 64. Accordingly, the space in the circuit boards occupied by the end faces of the wall 66 of the present invention may be made smaller, allowing further miniaturization of the electronic apparatus. Further, the shield cases may be made smaller resulting in a smaller overall apparatus. That is, the portable apparatus according to the present invention can be constructed to be smaller than the conventional portable apparatus. For example, the end face of the wall 66 of the conductive shield case 64 may have 0.8 mm thickness much smaller than the end faces of the wall of the conventional shield case made of the same material as the conductive shield case 64 having 2.6 mm thickness.

Further, in the prior art, the conductive braid materials must be attached to the grooves along the entire end faces, which is inconvenient. However, in accordance with the embodiment of the invention, when both end faces 66a, 66b of the wall 66 is clamped between the clamps 96a, 96b and 96c, 96d, the conductive component 68 is fastened to the shield case 64. Therefore, it is easier to attach the conductive component 68 to the shield case, compared to the conventional structure.

Furthermore, in accordance with the invention, only one conductive component 68 electrically connects the first ground 53 of the first circuit board 50 to the second ground 63 of the second circuit board 62. Therefore, portions between the first ground 53 and the second ground 63 have a resistance including two contact resistances. However, in the prior art, three components, including the first braid, the shield case, and the second braid, electrically connect the first ground of the first circuit board to the second ground of the second circuit board. Therefore, portions between the first and second grounds have a resistance including four contact resistances. Thus, in accordance with the invention, portions between the first ground 53 and the second ground 63 have a resistance which is less than that in the conventional structure. As a result, the structure in accordance with the embodiment of the invention can better shield the first and second circuitry blocks than the conventional structure.

Although the conductive component has been described to be made of metallic material, the conductive component can alternatively be made of conductive elastomer having a U-shape cross section engageable with the wall of the shield case.

Although the first contact portion 91 has been described to have a plurality of first contacts 91a, the first contact portion can alternatively have only one elongated contact. Likewise, although the second contact portion 92 has been described to have a plurality of second contacts 92a, the second contact portion 92 can alternatively only one elongated contact.

Although the shield case 64 has been described to be made of a non-conductive material plated with a conductive material, the shield case 64 can alternatively be made of a conductive material, such as an aluminum.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An electronic apparatus comprising:
a first circuit board having a first ground, a first circuitry block being mounted on the first circuit board;
a second circuit board having a second ground, a second circuitry block being mounted on the second circuit board;
a conductive shield case having a wall for protecting the first circuitry block and the second circuitry block, and a partition connected to the wall for electromagnetically isolating the first circuitry block from the second circuitry block, the wall having opposite ends; and
a conductive component including a fastening portion for fastening the conductive component to the conductive shield case, a first contact portion opposite to one end of the wall, a second contact portion opposite to the other end of the wall, and a connecting portion for connecting the first contact portion to the second contact portion, wherein the first contact portion contacts the first ground and the second contact portion contacts the second ground.

2. The electronic apparatus of claim 1 wherein one end of the wall comprises a first groove portion for receiving the first contact portion and the other end of the wall comprises a second groove portion for receiving the second contact portion.

3. The electronic apparatus of claim 2 wherein the first groove portion comprises a plurality of grooves, and the first contact portion comprises a plurality of contacts, and each of the contacts is positioned opposite to each of the grooves.

4. The electronic apparatus of claim 3 wherein each of the contacts is linearly spaced from the adjacent contact by a predetermined separation distance.

5. The electronic apparatus of claim 2 wherein the second groove portion comprises a plurality of grooves, and the second contact portion comprises a plurality of contacts, and each of the contacts is positioned opposite to each of the grooves.

6. The electronic apparatus of claim 5 wherein each of the contacts is linearly spaced from the adjacent contact by a predetermined separation distance.

7. The electronic apparatus of claim 1 wherein the conductive component comprises a metallic material.

8. The electronic apparatus of claim 1 wherein the first contact portion comprises an elastic portion.

9. The electronic apparatus of claim 1 wherein the second contact portion comprises an elastic portion.

10. The electronic apparatus of claim 1 wherein the fastening portion comprises a pair of clamping portions for clamping the wall of the conductive shield case.

11. A conductive component for use in an electronic apparatus having a first circuit board with a first ground and a first circuitry block, a second circuit board with a second ground and a second circuitry block, and a conductive shield case having a wall for protecting the first circuitry block and the second circuitry block, and a partition connected to the wall for electromagnetically isolating the first circuitry block from the second circuitry block, the wall having the opposite ends, the conductive component comprising:
a fastening portion for fastening the conductive component to the conductive shield case;
a first contact portion opposite to one end of the wall;
a second contact portion opposite to the other end of the wall; and
a connecting portion for connecting the first contact portion to the second contact portion,
wherein the first contact portion contacts the first ground and the second contact portion contacts the second ground.

12. The conductive component of claim 11 wherein said one end of the wall comprises a first groove portion for receiving the first contact portion and the other end of the wall comprises a second groove portion for receiving the second contact portion.

13. The conductive component of claim 12 wherein the first groove portion comprises a plurality of grooves, and the first contact portion comprises a plurality of contacts, and each of the contacts is positioned opposite to each of the grooves.

14. The conductive component of claim 13 wherein each of the contacts is linearly spaced from the other adjacent contact by a predetermined separation distance.

15. The conductive component of claim 12 wherein the second groove portion comprises a plurality of grooves, and the second contact portion comprises a plurality of contacts, and each of the contacts is positioned opposite to each of the grooves.

16. The conductive component of claim 15 wherein each of the contacts is linearly spaced from the adjacent contact by a predetermined separation distance.

17. The conductive component of claim 11 wherein the component comprises a metallic material.

18. The conductive component of claim 11 wherein the first contact portion comprises an elastic portion.

19. The conductive component of claim 11 wherein the second contact portion comprises an elastic portion.

20. The conductive component of claim 11 wherein the fastening portion comprises a pair of clamping portions for clamping the wall of the conductive shield case.

* * * * *